United States Patent
Mankos et al.

(10) Patent No.: US 8,461,526 B2
(45) Date of Patent: Jun. 11, 2013

(54) ELECTRON BEAM COLUMN AND METHODS OF USING SAME

(75) Inventors: Marian Mankos, Palo Alto, CA (US); Liqun Han, Pleasanton, CA (US); Xinrong Jiang, Palo Alto, CA (US); Rex Runyon, Fremont, CA (US); Carmela Moreno, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 258 days.

(21) Appl. No.: 12/958,174

(22) Filed: Dec. 1, 2010

(65) Prior Publication Data

US 2012/0138791 A1    Jun. 7, 2012

(51) Int. Cl.
*G01N 23/00* (2006.01)
(52) U.S. Cl.
USPC .............................. 250/307; 251/63; 251/193
(58) Field of Classification Search
USPC ........................................................... 250/307
See application file for complete search history.

(56) References Cited

U.S. PATENT DOCUMENTS

| | | | |
|---|---|---|---|
| 3,817,096 A * | 6/1974 | Osofsky | 73/167 |
| 3,930,181 A | 12/1975 | Pfeiffer | |
| 3,984,687 A | 10/1976 | Loeffler et al. | |
| 4,084,095 A | 4/1978 | Wolfe | |
| 4,560,878 A * | 12/1985 | Knauer et al. | 250/396 R |
| 5,102,093 A * | 4/1992 | Van Dyke | 251/63 |
| 5,466,942 A | 11/1995 | Sakai et al. | |
| 6,011,269 A | 1/2000 | Veneklasen et al. | |
| 6,448,568 B1 | 9/2002 | Allen et al. | |
| 7,109,486 B1 | 9/2006 | Spallas et al. | |
| 7,427,765 B2 | 9/2008 | Buller et al. | |
| 7,544,937 B2 | 6/2009 | Frosien | |
| 7,633,069 B2 | 12/2009 | Rafferty | |
| 7,800,075 B2 | 9/2010 | Buller et al. | |
| 7,821,187 B1 * | 10/2010 | Jiang et al. | 313/361.1 |
| 2002/0148971 A1 | 10/2002 | Sogard | |
| 2007/0085033 A1 | 4/2007 | Buller et al. | |
| 2008/0093561 A1 | 4/2008 | Rafferty | |
| 2008/0099710 A1 * | 5/2008 | Jennings | 251/203 |
| 2008/0308751 A1 | 12/2008 | Buller et al. | |

FOREIGN PATENT DOCUMENTS

JP    2003-173581 A    6/2003

OTHER PUBLICATIONS

PCT International Search Report for Application No. PCT/US2011/0062701, Jul. 9, 2012, 3 sheets.

* cited by examiner

*Primary Examiner* — Phillip A Johnston
(74) *Attorney, Agent, or Firm* — Okamoto & Benedicto LLP (57) ABSTRACT

In one embodiment, a first vacuum chamber of an electron beam column has an opening which is positioned along an optical axis so as to pass a primary electron beam that travels down the column. A source that emits electrons is positioned within the first vacuum chamber. A beam-limiting aperture is configured to pass a limited angular range of the emitted electrons. A magnetic immersion lens is positioned outside of the first vacuum chamber and is configured to immerse the electron source in a magnetic field so as to focus the emitted electrons into the primary electron beam. An objective lens is configured to focus the primary electron beam onto a beam spot on a substrate surface so as to produce scattered electrons from the beam spot. Controllable deflectors are configured to scan the beam spot over an area of the substrate surface. Other features and embodiments are also disclosed.

15 Claims, 6 Drawing Sheets

ELECTRON BEAM COLUMN AND METHODS OF USING SAME

BACKGROUND

1. Technical Field

The present invention relates generally to semiconductor manufacturing and related technologies. More particularly, the present invention relates to an electron beam column and methods for using the column in automated inspection and other applications.

2. Description of the Background Art

Automated electron beam inspection systems typically use an electron beam column to scan an electron beam across a region of a substrate surface to obtain image data. The present disclosure provides a novel and inventive electron beam column for use in automated electron beam inspection and other applications.

SUMMARY

One embodiment relates to an electron beam column. The column includes at least a first vacuum chamber, an electron source, a beam-limiting aperture, a magnetic immersion lens, a second vacuum chamber, a gate valve, an objective lens, and controllable deflectors. The first vacuum chamber has an opening which is positioned along an optical axis so as to pass a primary electron beam that travels down the column. A source that emits electrons is positioned within the first vacuum chamber. A beam-limiting aperture is configured to pass a limited angular range of the emitted electrons. A magnetic immersion lens is positioned outside of the first vacuum chamber and is configured to immerse the electron source in a magnetic field so as to focus the emitted electrons into the primary electron beam. An objective lens is configured to focus the primary electron beam onto a beam spot on a substrate surface so as to produce scattered electrons from the beam spot. Controllable deflectors are configured to scan the beam spot over an area of the substrate surface.

Another embodiment relates to a method of using an electron beam column. Electrons are emitted from a cathode of an electron source, and the emitted electrons are accelerated through an opening of an anode of the electron source. A limited angular range of the emitted electrons are passed through a beam-limiting aperture. The electron source is immersed in a magnetic field so as to focus the emitted electrons into a primary electron beam which travels down an optical axis of the column. The primary electron beam is passed from a first vacuum chamber through an opening to a second vacuum chamber. The primary electron beam is focused onto a beam spot on a substrate surface using an objective lens.

Another embodiment relates to an apparatus which includes at least a first vacuum chamber, an electron source, a beam-limiting aperture, a gun lens, a second vacuum chamber, a gate valve, an objective lens, controllable deflectors, a Wien filter, and a detector. The first vacuum chamber has an opening which is positioned along an optical axis so as to pass a primary electron beam that travels down the column. The electron source is positioned within the first vacuum chamber. The electron source includes a cathode configured to emit electrons, and an anode configured to accelerate the emitted electrons through an opening of the anode. The beam-limiting aperture is configured to pass a limited angular range of the emitted electrons, and the gun lens is configured to focus the emitted electrons into the primary electron beam. The second vacuum chamber has an opening which is aligned with the opening in the first vacuum chamber so as to receive the primary electron beam from the electron gun. The gate valve is closeable to seal the first vacuum chamber from the second vacuum chamber, and beam-current selection apertures are configured with different sizes so as to select different beam currents. The gate valve and the beam-current selection apertures are integrated into a combined mechanism. The objective lens is configured to focus the primary electron beam onto a beam spot on a substrate surface so as to produce scattered electrons from the beam spot, and the controllable deflectors are configured to scan the beam spot over an area of the substrate surface. The Wien filter is positioned within a cavity of the objective lens and is configured to deflect the scattered electrons from the optical axis, and the detector is configured to receive and detect the scattered electrons.

Another embodiment relates to an electron gun which includes at least a vacuum chamber, an electron source, a magnetic immersion lens, and a beam aligner. The vacuum chamber has an opening which is positioned along an optical axis so as to pass a primary electron beam that travels down an electron beam column. The electron source is positioned within the vacuum chamber. The electron source includes a cathode configured to emit electrons and an anode configured to accelerate the emitted electrons through an opening of the anode. The magnetic immersion lens is positioned outside of the first vacuum chamber and is configured to immerse the electron source in a magnetic field and focus the emitted electrons into the primary electron beam. The beam aligner is integrated into a pole piece gap of the magnetic immersion lens.

Other embodiments, aspects and feature are also disclosed.

DETAILED DESCRIPTION

Figure 1:
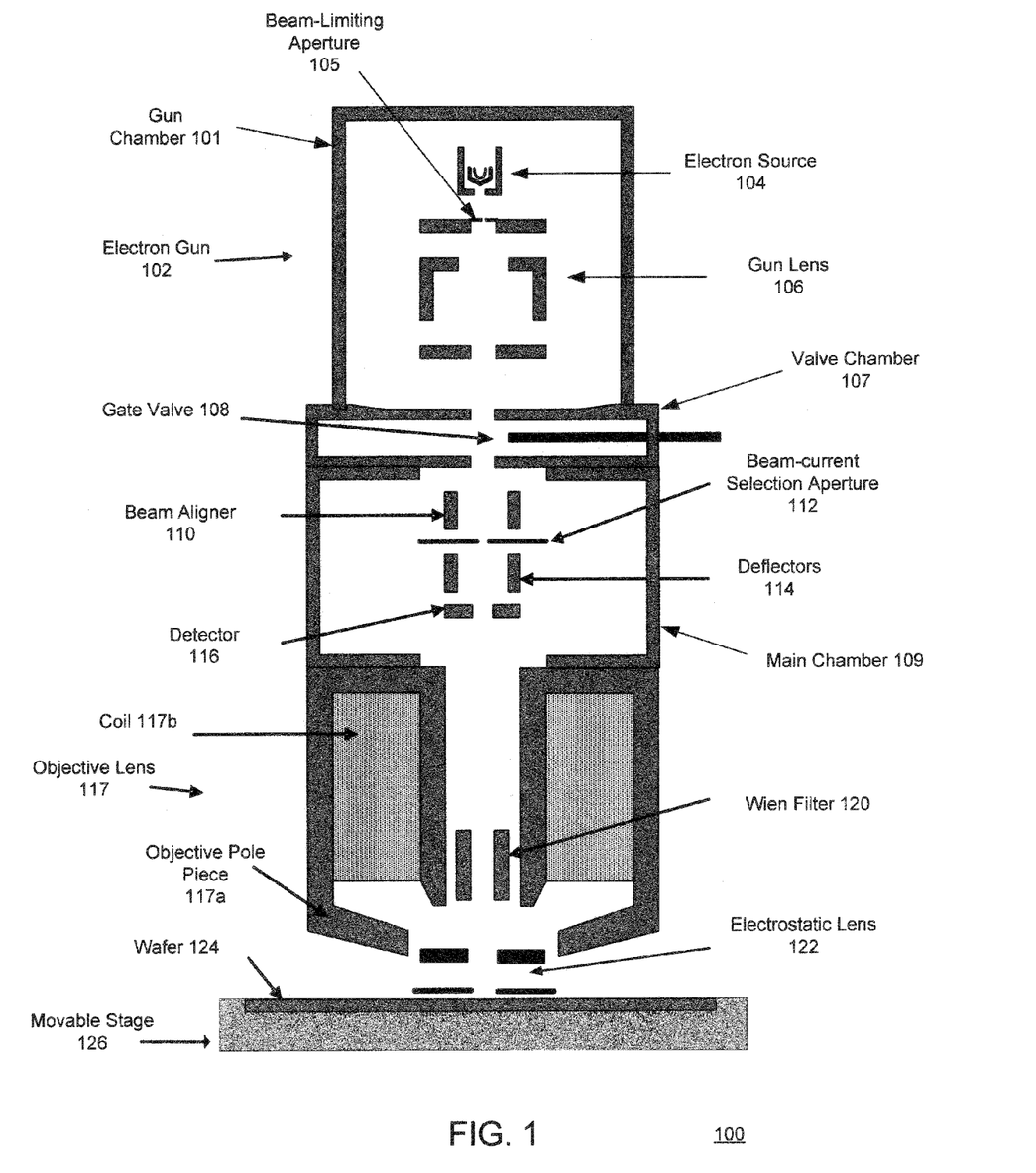
FIG. 1 is a cross-sectional diagram of a previous electron beam column for an automated inspection system.
Figure 2:
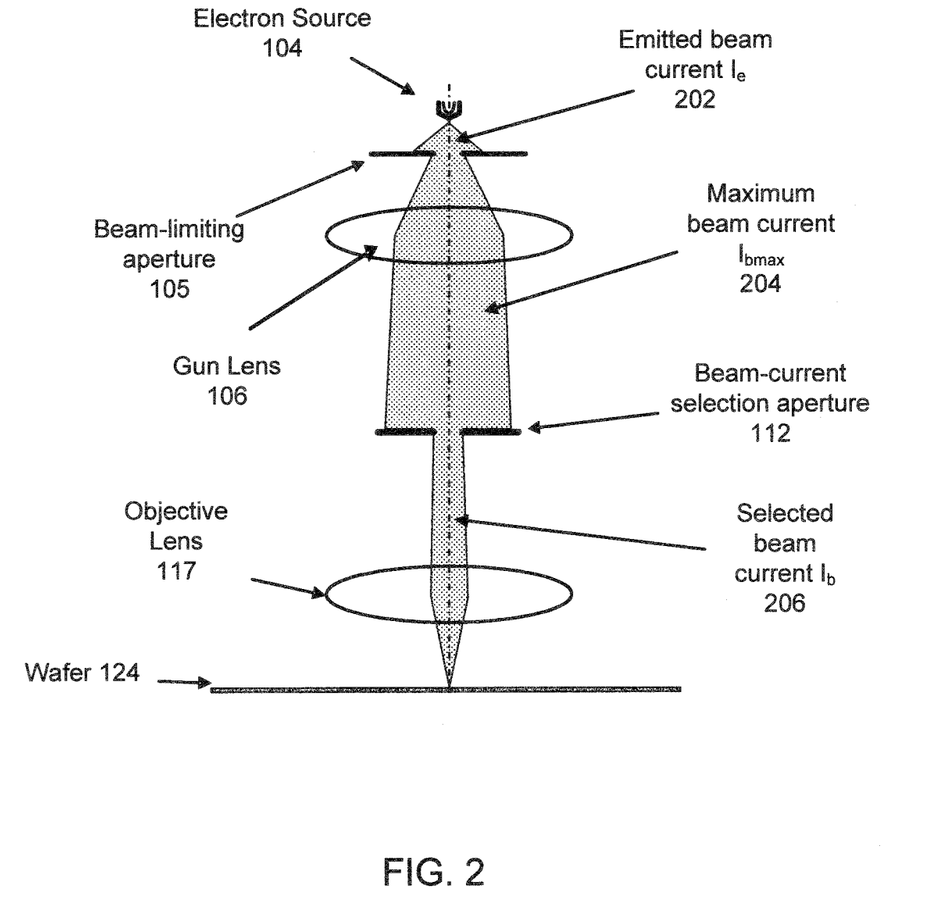
FIG. 2 is a diagram which illustrates electron beam currents during operation of the previous electron beam column of FIG. 1.

FIG. 1 is a cross-sectional diagram of a previous electron beam column 100 for an automated inspection system, and FIG. 2 is a diagram which illustrates electron beam currents during operation of the previous electron beam column of FIG. 1. The electron beam column 100 includes, among other components, an electron gun 102, a gate valve 108, a beam aligner 110, deflectors 114, a detector 116, an objective lens 117 and a movable stage 126 for holding a semiconductor wafer (or other target substrate) 124.

The electron gun 102 is housed in a gun chamber 101. The electron gun 102 includes an electron source 104, a beam-limiting aperture 105, and a gun lens 106. The electron source 104 includes a cathode and an anode. The cathode emits electrons that are accelerated through an opening in the anode, thus forming an emitted beam. (The emitted beam current $I_e$ 202 is depicted in FIG. 2.) The beam-limiting aperture 105 limits the angle of the emitted beam, and the gun lens 106 focuses the resultant beam. (The current of the beam passing through the beam-limiting aperture 105 may be referred to as the maximum beam current $I_{bmax}$ 204 and is depicted in FIG. 2.) The gun lens 106 is generally configured below the beam-limiting aperture 105 and is typically an electrostatic lens, though it may also be a magnetic lens.

The gate valve 108 is housed in a valve chamber 107. The gate valve 108 is configured to be either in an open or closed position. When the gate valve 108 is closed, the gun chamber 101 becomes sealed from the main chamber 109. When the gate valve 108 is open, the electron beam passes through the valve chamber 107 to the main chamber 109.

In the main chamber 109, the beam aligner 110 may use a controllable electrostatic deflector to align the beam along the optical axis of the column. The beam-current selection aperture 112 may be configured below the beam aligner 110. The beam-current selection aperture 112 may be a mechanism with a plurality selectable aperture sizes. (The current of the beam passing through the beam-current selection aperture 112 may be referred to as the selected beam current $I_b$ 206 and is depicted in FIG. 2.)

The deflectors 114 may be controllable electrostatic deflectors. For example, the deflectors 114 may be configured to controllably deflect the beam in the x and y directions (with the optical axis in the z direction) so as to raster scan the beam over a field of view on the surface of the wafer 124. The detector 116 may be configured below the deflectors. The primary beam (traveling towards the wafer 124) passes through an opening in the detector 116 and enters the objective lens 117.

The objective lens 117 is typically an electromagnetic lens comprising an objective pole piece 117a and a conductive coil 117b configured therein. A Wien filter 120 may be configured within the objective lens 117. An electrostatic lens 122 may be configured below the objective lens 117. The objective lens 117 focuses the primary beam (which passes through the Wien filter 120) onto a spot on the surface of the wafer (or other target substrate) 124, and the spot is scanned across the field of view by way of the controlled deflection caused by the deflectors 114. The wafer 124 may be held on a movable stage 126 so as to be able to inspect any region (or all regions) of the surface of the wafer 124.

The impingement of the primary beam onto the surface of the wafer 124 causes emission of secondary and/or backscattered electrons. These secondary and/or backscattered electrons may be referred to herein as scattered electrons. The scattered electrons are extracted by the electrostatic lens 122 and pass back up through the column. The Wien filter 120 deflects the scattered electrons so that their trajectory is at an angle with respect to the optical axis of the column. The off-axis scattered electrons impinge upon the detector 116 so as to generate a detection signal.

Figure 3:
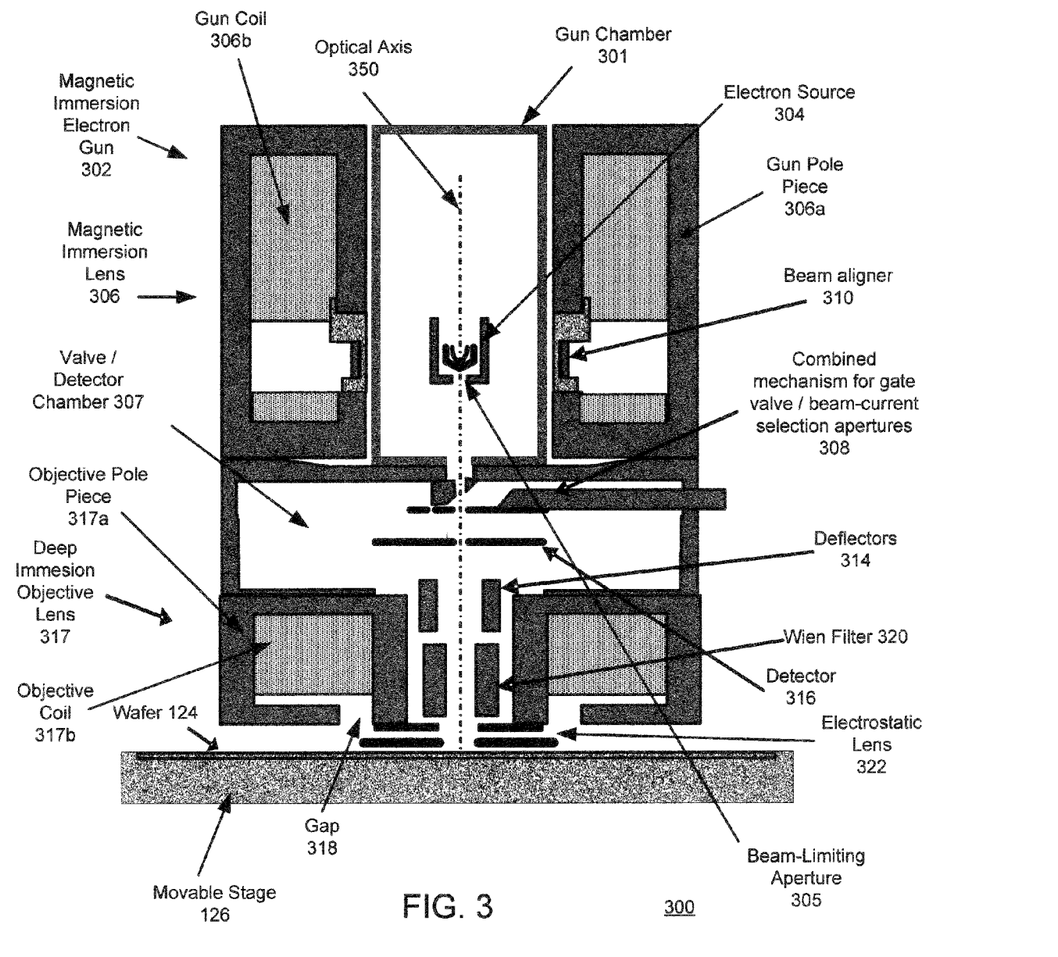
FIG. 3 is a cross-sectional diagram of an electron beam column in accordance with an embodiment of the invention.
Figure 4:
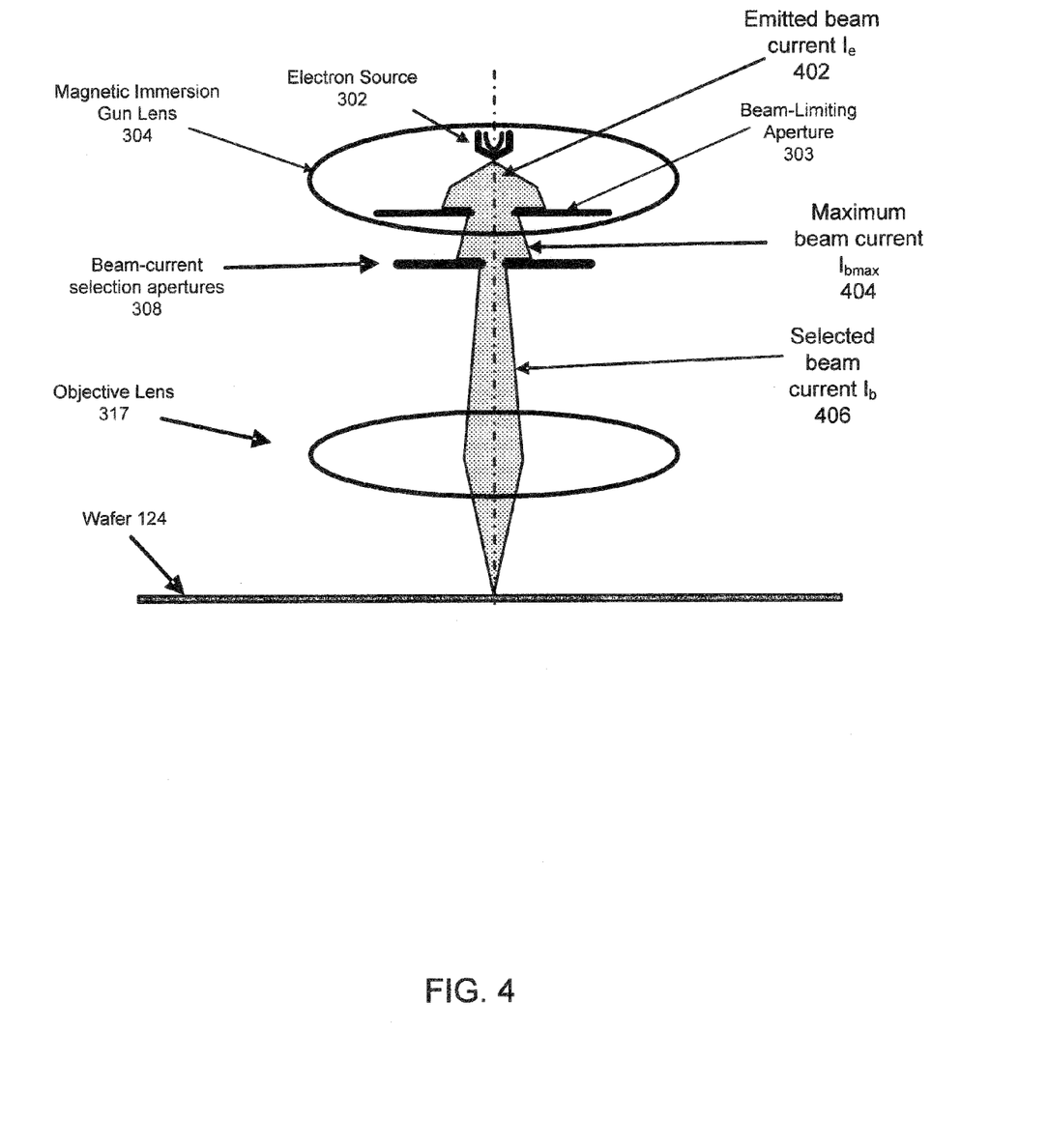
FIG. 4 is a diagram which illustrates electron beam currents during operation of the inventive electron beam column of FIG. 3.

FIG. 3 is a cross-sectional diagram of an electron beam column 300 in accordance with an embodiment of the invention, and FIG. 4 is a diagram which illustrates electron beam currents during operation of the inventive electron beam column of FIG. 3. The electron beam column 300 includes a magnetic immersion electron gun 302, a beam aligner 310 integrated into the electron gun 302, a mechanism 308 which integrates together a gate valve and beam-current selection apertures, a deep immersion objective lens 317, and other components.

The magnetic immersion electron gun 302 includes an electron source 304, a beam-limiting aperture 305, and a magnetic immersion lens 306. The electron source 304 includes a cathode and an anode. The cathode emits electrons that are accelerated through an opening in the anode, thus forming an emitted beam. (The emitted beam current $I_e$ 402 is depicted in FIG. 4.) The beam-limiting aperture 305 limits the angle of the emitted beam. (The current of the beam passing through the beam-limiting aperture 305 may be referred to as the maximum beam current $I_{bmax}$ 404 and is depicted in FIG. 4.)

In accordance with one aspect of the invention, the magnetic immersion lens 306 comprises a gun pole piece 306a and a gun coil 306b. While the electron source 304 is positioned within the gun chamber 301, the magnetic immersion lens 306 is configured outside of the gun chamber 301. Furthermore, the electron source 304 is positioned such that it is immersed within the magnetic field generated by the magnetic immersion lens 306.

In accordance with another aspect of the invention, a beam aligner 310 is included as part of the magnetic immersion gun 302. the beam aligner 310 may comprise a magnetic deflector which is controllable so as to align the beam with the optical axis 350 of the electron beam column 300.

In accordance with another aspect of the invention, a combined mechanism 308 is created for both the gate valve and the beam-current selection apertures. An exemplary implementation of the combined mechanism 308 is described further below in relation to FIGS. 5 and 6. When the combined mechanism 308 is configured as a closed gate valve, then the gun chamber 301 becomes sealed from the valve/detector chamber. When the combined mechanism 308 is configured as a beam-current selection aperture, then a selectable aperture size is used to provide a selected beam current. (The current of the beam passing through the beam-current selection aperture may be referred to as the selected beam current $I_b$ 406 and is depicted in FIG. 4.)

In accordance with another aspect of the invention, a single vacuum chamber (valve/detector chamber 307) encloses both the gate valve (on the combined mechanism 308) and the detector 316. In other words, there is no separate chamber for the gate valve. The detector 316 may be configured below the combined mechanism 308. The primary beam (traveling towards the wafer 124) passes through an opening in the detector 316 and enters the objective lens 317.

The deflectors 314 are configured about the optical axis and may be positioned such that a top portion is within the valve/detector chamber 307 and a lower portion is within the objective lens 317. The deflectors 314 may be controllable electrostatic deflectors which are configured to controllably deflect the beam in the x and y directions (with the optical axis in the z direction) so as to raster scan the beam over a field of view on the surface of the wafer 124.

The objective lens 317 may be configured as a deep immersion objective lens which immerses the wafer (target substrate) 124 in a magnetic field generated by the lens. The objective pole piece 317a is configured so that its gap 318 is facing towards the wafer 124 (and not towards the optical axis 350). A current is run through a conductive coil 317b within the objective pole piece 317a, and the generated magnetic field is output from the gap 318 so as to immerse the wafer 124.

A Wien filter 320 may be configured within the objective lens 317, and an electrostatic lens 322 may be configured below the objective lens 317. The deep immersion objective lens 317 focuses the primary beam (which passes through the Wien filter 320) onto a spot on the surface of the wafer (or other target substrate) 124, and the spot is scanned across the field of view by way of the controlled deflection caused by the deflectors 314. The wafer 124 may be held on a movable stage 126 so as to be able to inspect any region (or all regions) of the surface of the wafer 124.

The impingement of the primary beam onto the surface of the wafer 124 causes emission of secondary and/or backscattered electrons. These secondary and/or backscattered electrons may be referred to herein as scattered electrons. The scattered electrons are extracted by the electrostatic lens 322 and pass back up through the column. The Wien filter 320 deflects the scattered electrons so that their trajectory is at an angle with respect to the optical axis of the column. The off-axis scattered electrons impinge upon the detector 316 so as to generate a detection signal.

As seen in FIG. 4, a distance along the optical axis from the beam-limiting aperture to the beam-current selection aperture is preferably one-third to one-fourth (⅓ to ¼) of a distance along the optical axis from the beam-current selection aperture to the substrate surface. This contrasts with FIG. 2 which shows a distance along the optical axis from the beam-limiting aperture to the beam-current selection aperture that is about the same as a distance along the optical axis from the beam-current selection aperture to the substrate surface.

Figure 5:
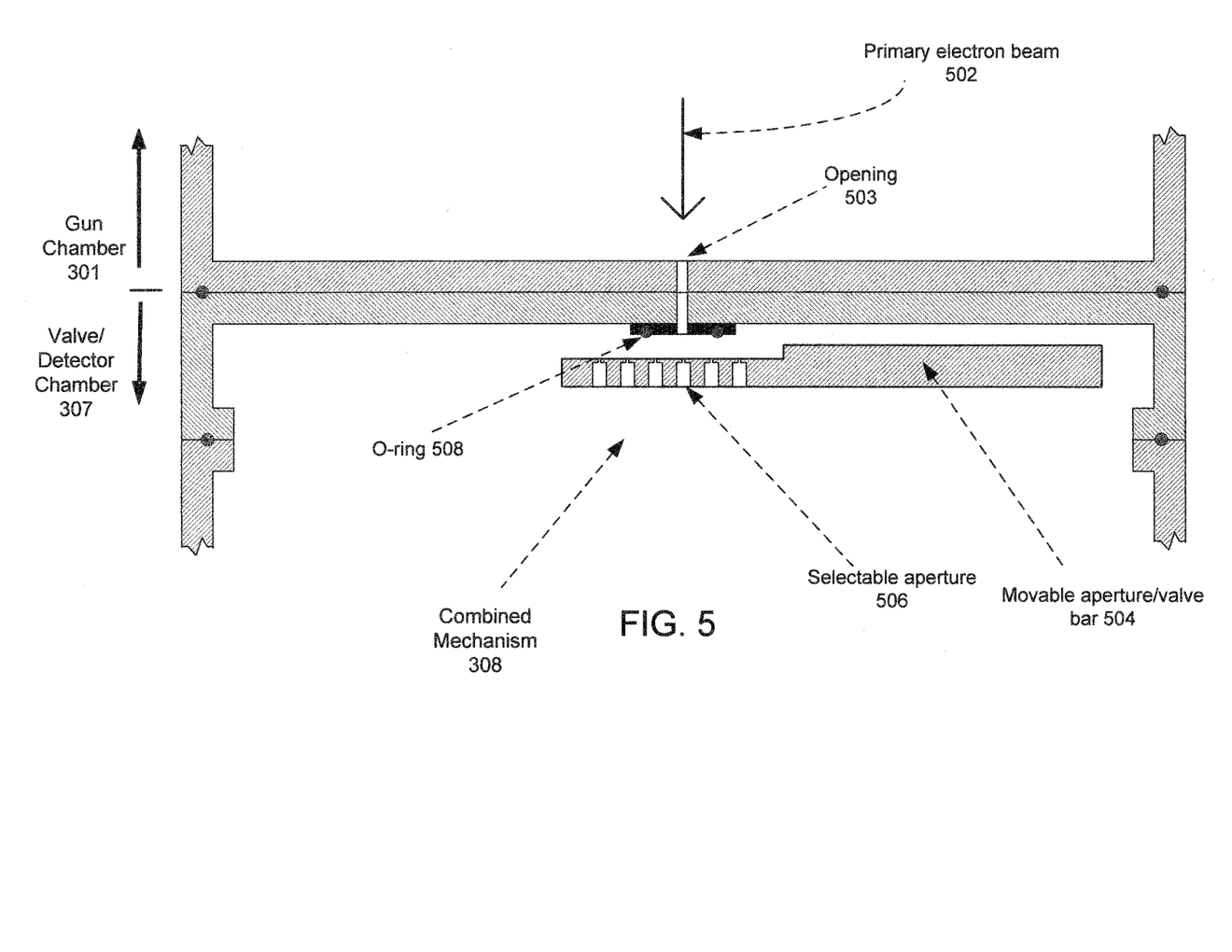
FIGS. 5 and 6 are cross-sectional diagrams showing an implementation of a combined mechanism for a gate valve/beam-current selection aperture in accordance with an embodiment of the invention.
Figure 6:
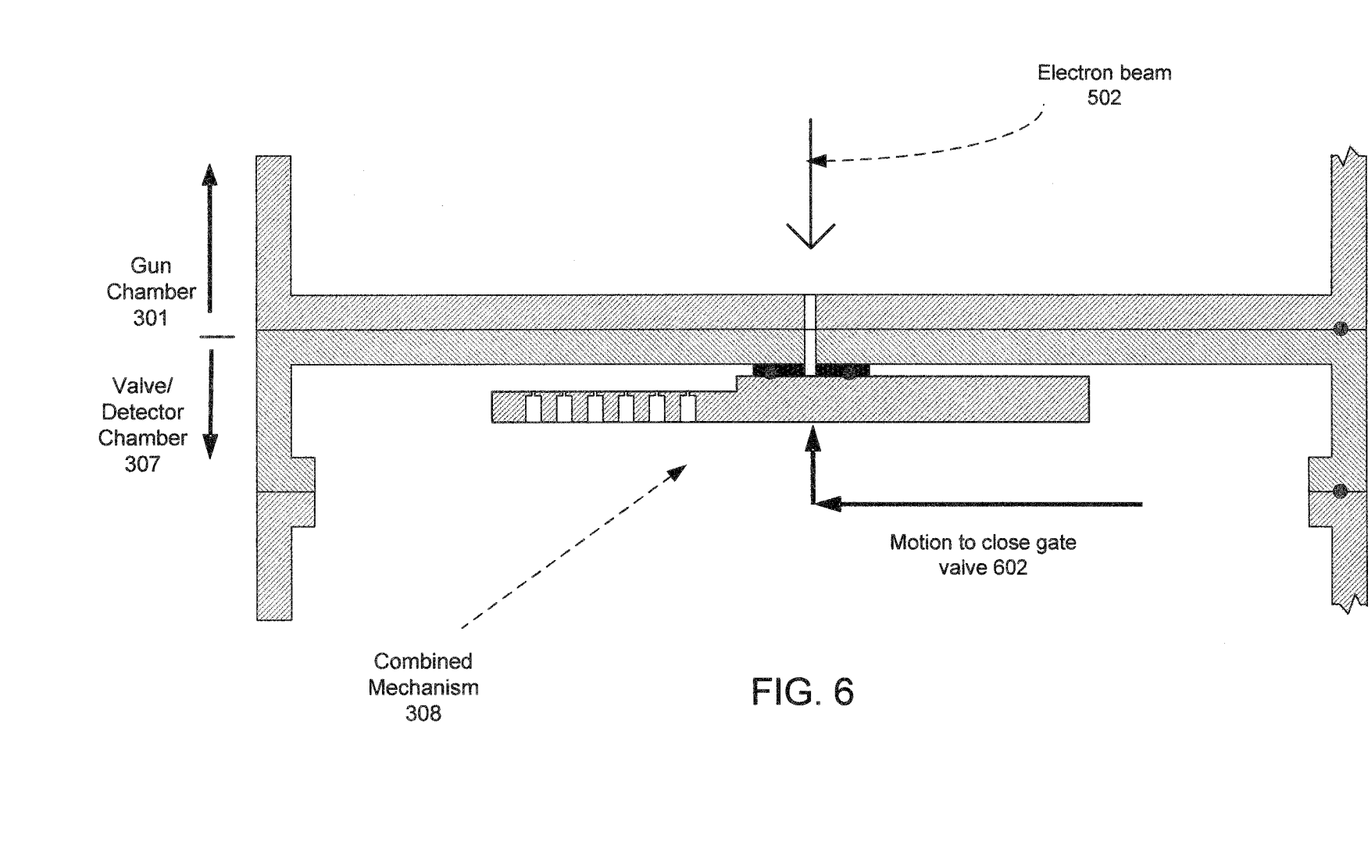

FIGS. 5 and 6 are cross-sectional diagrams showing an implementation of a combined mechanism 308 for a gate valve/beam-current selection aperture in accordance with an embodiment of the invention. As shown, the combined mechanism 308 is configured at a top region of the valve/detector chamber 307. The combined mechanism 308 is configured below an opening 503 along the optical axis 350 from the gun chamber 301. The combined mechanism 308 includes a movable aperture/valve bar 504.

As shown in FIG. 5, the movable aperture/valve bar 504 may be set or positioned such that one of the selectable apertures 506 is positioned directly below the opening 503 (i.e. at the optical axis 350). In this case, the primary electron beam 502 is limited by the selected aperture so that the selected beam current $I_b$ 406 passes through the aperture (while the remaining portion of the maximum beam current $I_{bmax}$ 404 is blocked).

As shown in FIG. 6, the movable aperture/valve bar 504 may be moved 602 in a sideways and then upwards motion so as to close the gate valve. The upward motion presses a solid part of the movable aperture/valve bar 504 against an O-ring 508 positioned around the opening 503. This blocks the primary electron beam 502 and creates a vacuum seal between the gun chamber 301 and the valve/detector chamber 307.

CONCLUSION

The throughput of electron beam inspection systems is generally limited by aberrations and electron-to-electron interactions. The conventional electrostatic electron gun and the conventional objective lens for an electron beam column have substantial spherical and chromatic aberrations. These aberrations are a substantial source of image blur for the overall column at certain column conditions, in particular for high beam current conditions.

Advantageously, by using the apparatus and methods disclosed above in accordance with embodiments of the invention, the throughput for an electron inspection apparatus may be greatly increased. In particular, applicants have created an innovative electron beam column which has a length (along the optical axis) that is considerably less than the length of a prior electron beam column. The reduced length of the electron beam column disclosed herein enables the electron beam to travel a shorter distance from source to wafer. This results in decreased electron-to-electron interactions and, hence, reduced blur in the image data.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam column comprising:
   a first vacuum chamber having an opening which is positioned along an optical axis so as to pass a primary electron beam that travels down the column;
   an electron source positioned within the first vacuum chamber, the electron source including a cathode configured to emit electrons, and an anode configured to accelerate the emitted electrons through an opening of the anode;
   a beam-limiting aperture configured to pass a limited angular range of the emitted electrons;
   a magnetic immersion lens positioned outside of the first vacuum chamber which is configured to immerse the electron source in a magnetic field so as to focus the emitted electrons into the primary electron beam;
   a second vacuum chamber with an opening which is aligned with the opening in the first vacuum chamber so as to receive the primary electron beam from the electron gun;
   an o-ring around the opening in the second vacuum chamber;
   a movable bar comprising a thinner portion, a thicker portion, and selectable apertures in the thinner portion, wherein the movable bar is arranged such that the thicker portion contacts the o-ring when in a closed valve position;
   an objective lens configured to focus the primary electron beam onto a beam spot on a substrate surface so as to produce scattered electrons from the beam spot; and
   controllable deflectors configured to scan the beam spot over an area of the substrate surface.

2. The electron beam column of claim 1, wherein the controllable deflectors are positioned partially in the second vacuum chamber and partially in a cavity of the objective lens.

3. The electron beam column of claim 1, further comprising:
   a Wien filter positioned within a cavity of the objective lens and configured to deflect the scattered electrons from the optical axis; and a detector configured to receive and detect the scattered electrons.

4. The electron beam column of claim 3, wherein the movable bar and the detector are arranged within the second chamber.

5. The electron beam column of claim 1, wherein the selectable apertures are of:
different sizes so as to select different beam currents.

6. The electron beam column of claim 5, wherein a distance along the optical axis from the beam-limiting aperture to the selectable apertures on the movable bar is one-third to one-fourth of a distance along the optical axis from the selectable apertures on the movable bar to the substrate surface.

7. The electron beam column of claim 1, wherein a magnetic beam aligner is arranged within a pole piece gap of the magnetic immersion lens.

8. A method of using an electron beam column, the method comprising:
opening a valve between a first vacuum chamber and a second vacuum chamber by moving a bar such that a thicker portion of the bar no longer contracts an o-ring around an opening between the first and second vacuum chambers and aligning an aperture in a thinner portion of the bar with the opening;
emitting electrons from a cathode;
accelerate the emitted electrons through an opening of an anode;
passing a limited angular range of the emitted electrons through a beam-limiting aperture;
immersing the electron source in a magnetic field so as to focus the emitted electrons into a primary electron beam which travels down an optical axis of the column;
passing the primary electron beam from the first vacuum chamber through the opening to the second vacuum chamber; and
focusing the primary electron beam onto a beam spot on a substrate surface using an objective lens.

9. The method of claim 8, further comprising:
producing scattered electrons from the beam spot; and
scanning the beam spot over an area of the substrate surface using controllable deflectors, wherein the controllable deflectors are positioned partially in the second vacuum chamber and partially in a cavity of the objective lens.

10. The method of claim 9, further comprising:
deflecting the scattered electrons from the optical axis using a Wien filter positioned within a cavity of the objective lens; and
detecting the scattered electrons.

11. The method of claim 8, further comprising:
selecting a beam current by aligning a different size aperture in the thinner portion of the bar with the opening.

12. The method of claim 11, wherein a distance along the optical axis from the beam-limiting aperture to the aperture in the thinner portion of the bar is one-third to one-fourth of a distance along the optical axis from the aperture in the thinner portion of the bar to the substrate surface.

13. An apparatus comprising:
a first vacuum chamber having an opening which is positioned along an optical axis so as to pass a primary electron beam that travels down the column;
an electron source positioned within the first vacuum chamber, the electron source including a cathode configured to emit electrons, and an anode configured to accelerate the emitted electrons through an opening of the anode;
a beam-limiting aperture configured to pass a limited angular range of the emitted electrons;
a gun lens which is configured to focus the emitted electrons into the primary electron beam;
a second vacuum chamber with an opening which is aligned with the opening in the first vacuum chamber so as to receive the primary electron beam from the electron gun;
an o-ring around the opening in the second vacuum chamber;
a movable bar comprising a thinner portion, a thicker portion, and selectable apertures in the thinner portion, wherein the movable bar is arranged such that the thicker portion contacts the o-ring when in a closed valve position;
an objective lens configured to focus the primary electron beam onto a beam spot on a substrate surface so as to produce scattered electrons from the beam spot;
controllable deflectors configured to scan the beam spot over an area of the substrate surface;
a Wien filter positioned within a cavity of the objective lens and configured to deflect the scattered electrons from the optical axis; and
a detector configured to receive and detect the scattered electrons.

14. The apparatus of claim 13, wherein the controllable deflectors are positioned partially in the second vacuum chamber and partially in a cavity of the objective lens.

15. The apparatus of claim 13, wherein a distance along the optical axis from the beam-limiting aperture to the selection aperture selectable apertures on the moveable bar is one-third to one-fourth of a distance along the optical axis from the selectable apertures on the moveable bar to the substrate surface.

* * * * *